United States Patent [19]

Chapman et al.

[11] 4,038,614
[45] July 26, 1977

[54] FRACTIONAL EFFICIENCY COUPLER

[75] Inventors: Charles Weldon Chapman; Thomas W. Bristol, both of Orange, Calif.

[73] Assignee: Hughes Aircraft Company, Culver City, Calif.

[21] Appl. No.: 587,485

[22] Filed: June 16, 1975

[51] Int. Cl.$^2$ .................... H03H 9/26; H03H 9/30; H03H 9/32; H01L 41/04
[52] U.S. Cl. .................... 333/30 R; 310/8.2; 310/9.8; 333/72
[58] Field of Search ............... 333/30 R, 72; 310/8, 310/8.1, 8.2, 9.7, 9.8

[56] References Cited

U.S. PATENT DOCUMENTS

| | | | |
|---|---|---|---|
| 3,836,876 | 9/1974 | Marshall et al. | 333/30 R |
| 3,859,608 | 1/1975 | Hartmann et al. | 333/72 |
| 3,898,592 | 8/1975 | Solie | 333/72 |
| 3,911,381 | 10/1975 | Brooks et al. | 333/72 |
| 3,947,783 | 3/1976 | Maerfeld | 333/30 R |

OTHER PUBLICATIONS

Marshall et al., "Surface Acoustic Wave Multistrip Components and Their Applications", IEEE Trans. on Microwave Theory and Techniques, vol. MTT-21, No. 4, Apr. 1973; pp. 216-225.

*Primary Examiner*—Alfred E. Smith
*Assistant Examiner*—Marvin Nussbaum
*Attorney, Agent, or Firm*—John Holtrichter, Jr.; W. H. MacAllister

[57] ABSTRACT

Surface acoustic wave devices having broadband characteristics with a desired transfer efficiency of less than unity at a desired center frequency are described, the devices incorporate a multistrip coupler array of a predetermined number N of conductive strips disposed on a piezoelectric substrate which is capable of supporting two tracks of approximately equal widths of propagating surface acoustic wave energy, the array having a tapping portion in one of the tracks and an approximately equal length launching portion in the other of the tracks for launching only a portion of the energy incident on the tapping portion, the strip periods $p_1$ and $p_2$ of the two portions being different and the ratio of $p_1/p_2$, in conjunction with N, provides the desired characteristic.

5 Claims, 8 Drawing Figures

FRACTIONAL EFFICIENCY COUPLER

The invention herein described was made in the course of or under a contract with the United States Army.

BACKGROUND OF THE INVENTION

The background of the invention will set forth in two parts.

1. Field of the Invention

This invention relates to surface acoustic wave devices and more particularly to such devices providing fractional efficiency coupling between two tracks of propagating surface acoustic wave energy.

2. Description of the Prior Art

The basic concept of a surface acoustic wave device generally referred to as a multistrip coupler was first introduced by F. G. Marshall, C. O. Newton and E. G. S. Paige while working with the Royal Radar Establishment, Great Malvern, Worcestershire, England. The design and potential usefulness of this type of device is set forth by them in articles in such publications as *IEEE Transactions, Microwave Theory & Techniques*, MTT-21, 206 (1973) and *IEEE Transactions, Microwave Theory & Techniques*, MTT-21, 216 (1973).

Most of the multistrip components described in these and similar articles require coupling efficiencies of −3 dB or less, and take advantage of the 90° phase shift between the coupled and uncoupled output ports to provide signal cancellation at specific, selected ports. These components include the reflecting track changer, the echo trap, and others.

The basic problem with these fractional efficiency multistrip couplers is that they are intrinsically narrowband. This results because the maximum in frequency response occurs at the stopband frequency. At practical operating frequencies in the vicinity of one-half the stopband frequency, the coupling efficiency varies rapidly and monotonically with frequency.

As will be subsequently described in greater detail, geometrical parameters for synthesizing fractional efficiency multistrip type surface acoustic wave couplers having broad, symmetrical passbands have now been formulated utilizing a field theoretical model. A description of this model may be found in a doctoral dissertation by Charles Maerfeld entitled "Coupleurs Directifs et Amplificateurs D'ondes Acoustiques de Surface a Bandes Metalliques Multiples," University of Nice, France, June, 1973; and an article entitled "Perturbation Theory for the Surface Wave Multistrp Coupler" by Charles Maerfeld and P. Tournois, in *Electronics Letters*, Vol. 9, pages 115 and 116, March 1973.

The present invention, utilizing the aforementioned formulation, has been used to determine the significant geometrical alterations of the basic multistrip coupler configuration required to make broadband couplers. The significant change is that the strip period $p_1$ in the input track differs from the strip period $p_2$ in the output track. By appropriately adjusting the ratio $p_1/p_2$ and properly selecting N, the number of strips, broadband couplers with any desired transfer efficiency less than unity may be designed.

In an article in *Electronics Letters*, Vol. 9, page 432, (1973), Charles Maerfeld and G. W. Farnell describe an acoustic beam compressor using a multistrip coupler having different strip periods. Although somewhat similar in appearance to the present invention, the device described was for only providing total energy transfer from adjacent tracks of unequal width. Devices with 100% coupling efficiency, as in the acoustic beam compressor, do not possess a frequency response problem.

SUMMARY OF THE INVENTION

In view of the foregoing factors and conditions characteristic of the prior art, it is a primary object of the present invention to provide an improved surface acoustic wave device utilizing a multistrip coupler component.

Another object of the present invention is to provide a fractional efficiency surface acoustic wave coupler having a broad, symmetrical passband.

A futher object of the present invention is to provide a fractional efficiency surface acoustic wave coupling device utilizing a multistrip coupling array having equal length tapping and launching portions wherein the strip periods of these portions are different and goverened by a predetermined strip period ratio.

Still another object of the present invention is to provide a broadband surface acoustic wave 90° hybrid junction.

Yet another object of the present invention is to provide a broadband, nonreflecting tapped delay line.

Still a further object of the present invention is to provide a broadband surface acoustic wave multistrip coupler type echo trap.

Yet a further object of the present invention is to provide a broadband multistrip coupler surface acoustic wave reflector.

In accordance with the present invention, a fractional efficiency surface acoustic wave coupler includes a multistrip coupling array of a predetermined number N of conductive strips disposed on a substrate of piezoelectric material having a surface capable of supporting propagating surface acoustic wave energy along first and second tracks of approximately equal widths. The coupling array has a tapping portion in the first track and an approximately equal length launching portion in the second track for launching along the second track only a fraction of the surface acoustic wave energy incident on the tapping portion. The strip period $p_1$ of the strips in the tapping portion are different than the strip period $p_2$ of the strips in the launching portion, the strip period difference being defined by a predetermined strip period ratio $p_1/p_2$. This ratio, in conjunction with the predetermined strip number N, provides a broadband device having a directional transfer efficiency less than unity at a desired center frequency.

The features of the present invention which are believed to be novel are set forth with particularity in the appended claims. The present invention, both as to its organization and manner of operation, together with further objects and advantages thereof, may be best understood by making reference to the following description, taken in conjunction with the accompanying drawings in which like reference characters refer to like elements in the several views.

BRIEF DESCRIPTION OF THE DRAWINGS

FIG. 8 illustrates the geometrical configuration of a broadband reflecting track changer incorporating a broadband $-3$ dB hybrid and broadband reflectors, in accordance with another embodiment of the invention.

DESCRIPTION OF THE PREFERRED EMBODIMENTS

Figure 1:
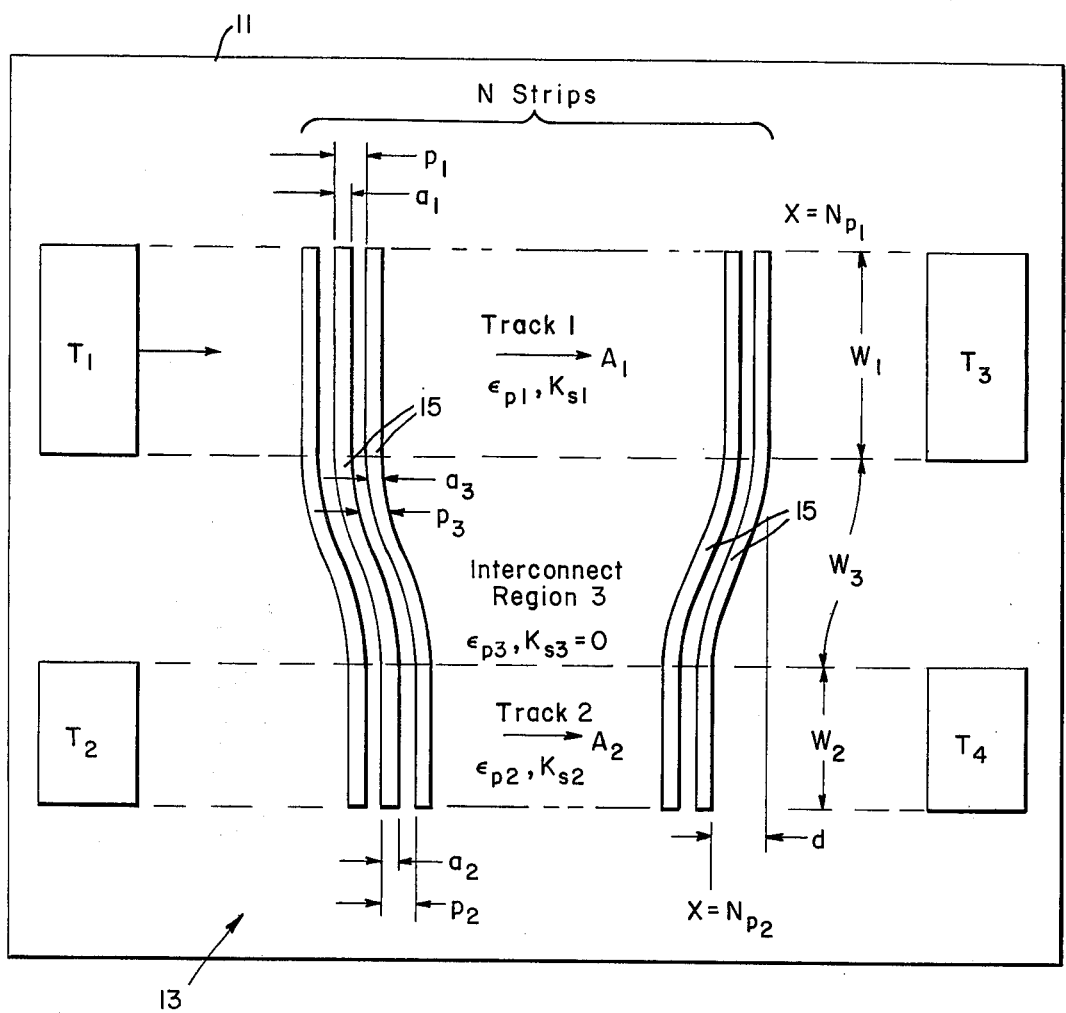
FIG. 1 is a schematic representation of the geometrical and material parameters for a fractional efficiency coupler incorporating a multistrip coupler array constructed in accordance with the present invention.

Referring now to the drawings and more particularly to FIG. 1, there is schematically shown the geometric and material parameters appropriate to establish a desired symmetrical broadband response in a fractional efficiency coupler constructed in accordance with the present invention. This figure shows conventional electro-acoustic transducers $T_1 - T_4$ disposed on a surface 11 of a piezoelectric substrate material such as $LiNbO_3$, for example, along with a special multistrip coupler array 13 having N spaced conductive strips 15.

In the following mathematical analysis, $K_{sn}$ and $\alpha_{pn}$ refer respectively to the piezoelectric coupling factor and effective dielectric constant of the piezoelectric substrate of track $n$ ($n = 1, 2, 3$). Usually there is a common substrate so that these values are the same in each track, but the coupling factor is neglected in the interconnection region ($n = 3$) to simplify the analysis.

A surface acoustic wave of amplitude A and free space wave number $k(= 2\mu/\lambda)$ launched from transducer $T_1$ in Track 1 results in two waves $A_1$ and $A_2$ in Tracks 1 and 2, respectively, given by $$A_1(x) = A_{o1}^+ exp(ik_1^+ x) + A_{o1}^- exp(ik_1^- x)$$

$$A_2(x) = A_{o2}^+ exp(ik_2^+ x) + A_{o2}^- exp(ik_2^- x)$$

where $k_1^+$ and $k_1^-$ are the larger and smaller roots of the quadratic equation $$\{C_1(1-\zeta_{s1})(1-\zeta_{a2}) + c_2(1-\zeta_{a1})(1-\zeta_{s2})$$
$$+ c_3(1-\zeta_{a1})(1-\zeta_{a2})\}[(k_1'-k)/k]^2$$
$$- \{c_1[(1-\zeta_{s1})(\delta+\zeta_{a2}) + \zeta_{s1}(1-\zeta_{a2})]$$
$$+ c_2[(1-\zeta_{a1})(\delta+\zeta_{s2}) + \zeta_{a1}(1-\zeta_{s2})]$$
$$+ c_3[(1-\zeta_{a1})(\delta+\zeta_{a2}) + \zeta_{a1}(1-\zeta_{a2})]\}[(k_1'-k)k]$$
$$+ c_1\zeta_{s1}(\delta+\zeta_{a2}) + c_2\zeta_{a1}(\delta+\zeta_{s2}) + c_3\zeta_{a1}(\delta+\zeta_{a2}) = 0$$

where $k_1'$ denotes $k_1^+$ or $k_1^-$, and $$c_n = 2w_n(\epsilon_o + \epsilon_{pn}) P_{-\gamma}(\cos \Theta_n)/P_{-\gamma}(-\cos \Theta_n)\frac{\sin \pi\gamma^*}{\pi\gamma},$$

$$\zeta_{sn} = \frac{1}{4} K_{sn}^2[1 - P_\gamma(\cos \Theta_n)/P_{+\gamma}(\cos \Theta_n)],$$

$$\zeta_{an} = \frac{1}{4} K_{sn}^2[1 + P_\gamma(-\cos \Theta_n)/P_{-\gamma}(\cos \Theta_n)],$$

and $$\delta = (p_2 - p_1)/p_1,$$

in which $\Theta_n = \pi a_n/pn$, $\gamma = p_1/\lambda$, and $P_\gamma(\cos \theta)$ is the Legendre function of degree $\gamma$.

$k_2^+$ and $k_2^-$ are determined from the requirement that $k_1^\pm p_1 = k_2^\pm p_2$.

The amplitudes $A_{on}^\pm$ are given by $$A_{o1}^+ = A\tau^-/(\tau^- - \tau^+)$$

$$A_{o1}^- = -A\tau^+/(\tau^- - \tau^+)$$

$$A_{o2}^+ = -A_{o2}^- = A\tau^+ \tau^-/(\tau^- - \tau^+)$$

where $$\tau^\pm = \frac{K_{s2}^2 P_{-\gamma}(-\cos \Theta_1)}{K_{s1}^2 _{-\gamma}(-\cos \Theta_2)}$$

$$\left\{ \frac{[(k_1^\mp -k)/k](1-\zeta_{a1})-\zeta_{a1}}{[(k_1^\mp -k)/k](1-\zeta_{a2})-(\delta+\zeta_{a2})} \right\}$$

From these equations the multistrip coupler outputs from Track 1 and Track 2 are determined:

$$A_1 = B_1 \exp(i\psi) \exp(ik_{el}Np_1)$$

$$A_2 = B_2\exp(-i\pi/2) \exp(ik_{el}Np_1)$$

where $$B_1 = [(A_{o1}^+ - A_{o1}^-)^2 \sin^2(\Delta k_1 Np_1/2)$$
$$+ (A_{o1}^+ - A_{o1}^-)^2 \cos^2(\Delta k_1 Np_1/2)]^{1/2},$$
$$B_2 = -2a_{o2}^+ \sin(\Delta k_1 Np_1/2),$$

$$\psi = \tan^{-1}\left[\frac{A_{o1}^+ + A_{o1}^-}{A_{o1}^+ + A_{o1}^-}\tan(\Delta k_1 Np_1/2)\right],$$

$$k_{el} = \frac{1}{2}(k_1^+ + k_1^-),$$

and $$\Delta k_1 = k_1^+ - k_1^-.$$

The fraction of power transferred from the input transducer $T_1$ to the coupled and uncoupled output transducers $T_3$ and $T_4$ are given respectively by $$P_{13} = \left|\frac{A_1}{A}\right|^2$$

$$P_{14} = \frac{w_2}{w_1}\left|\frac{A_2}{A}\right|^2.$$

By correctly choosing the values of $p_1$, $p_2$ and N broadband responses of the desired transfer efficiency $P_{14}$ can be obtained symmetrical about the selected center frequency. The appropriate values to satisfy a given requirement must generally be determined using an iterative computer search process.

The phase relationship between the coupled and uncoupled outputs, important in many multistrip coupler components, can be established by evaluating $\psi$, which is approximately a linear function of frequency. The effect of the offset $d$ (shown in FIG. 1) on the phase relationship must also be considered. The offset $d$ may be chosen equal to zero, but it frequently is designed to be nonzero to compensate for the delay caused by $\psi$. For more specific details as to the above mathematical analysis and examples of applications, reference may be made to a publication by C. W. Chapman and T. W. Bristol entitled "Acoustic Multistrip Device Techniques," in a Research and Development Technical Report, ECOM-73-0276-F, U.S. Army Electronics Command, Fort Monmouth, New Jersey, April 1975.

Figure 2:
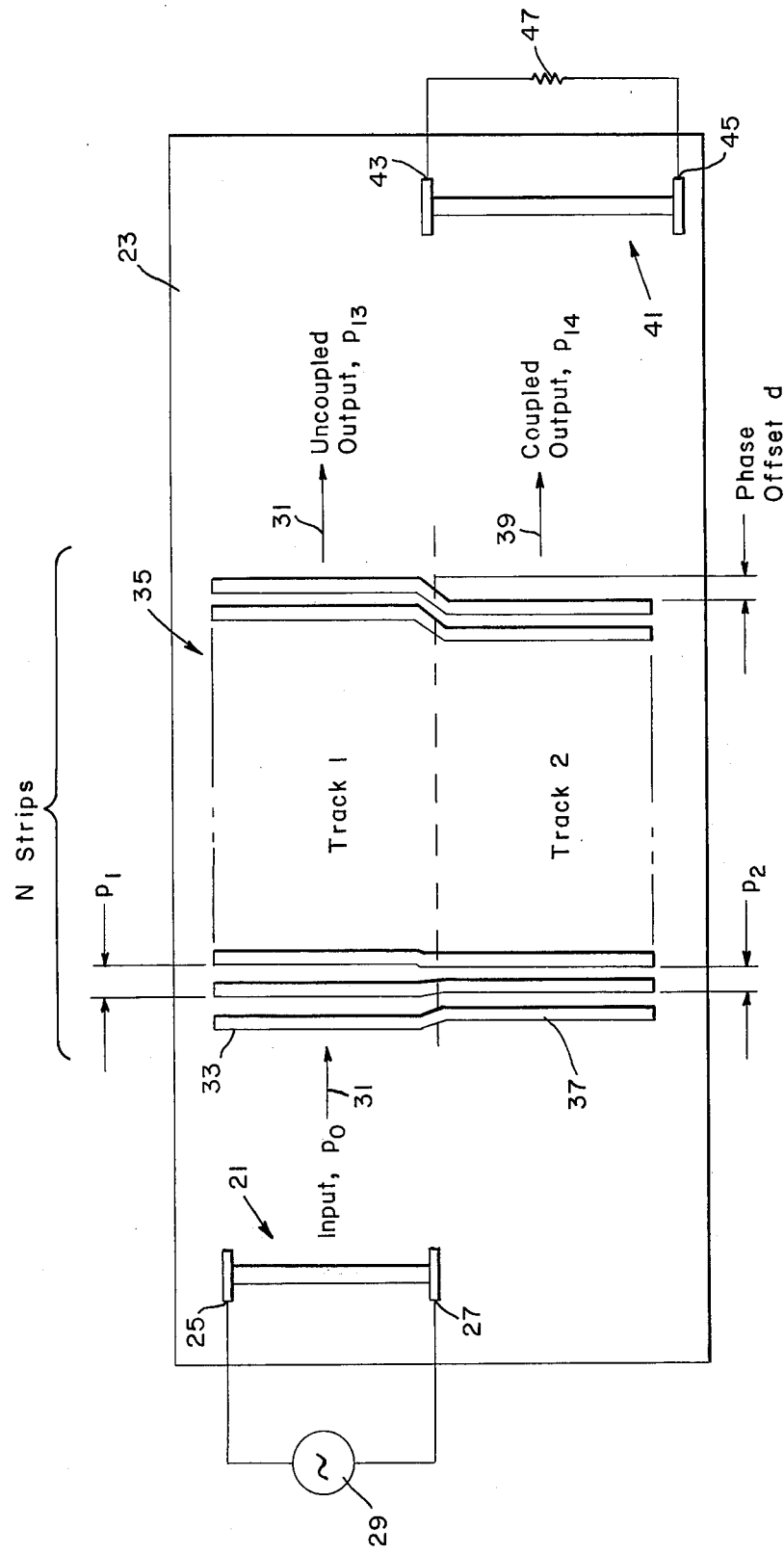
FIG. 2 is a schematically represented two track surface acoustic wave fractional efficiency coupler having a single input transducer and a single output transducer in accordance with one embodiment of the present invention.
Figure 3:
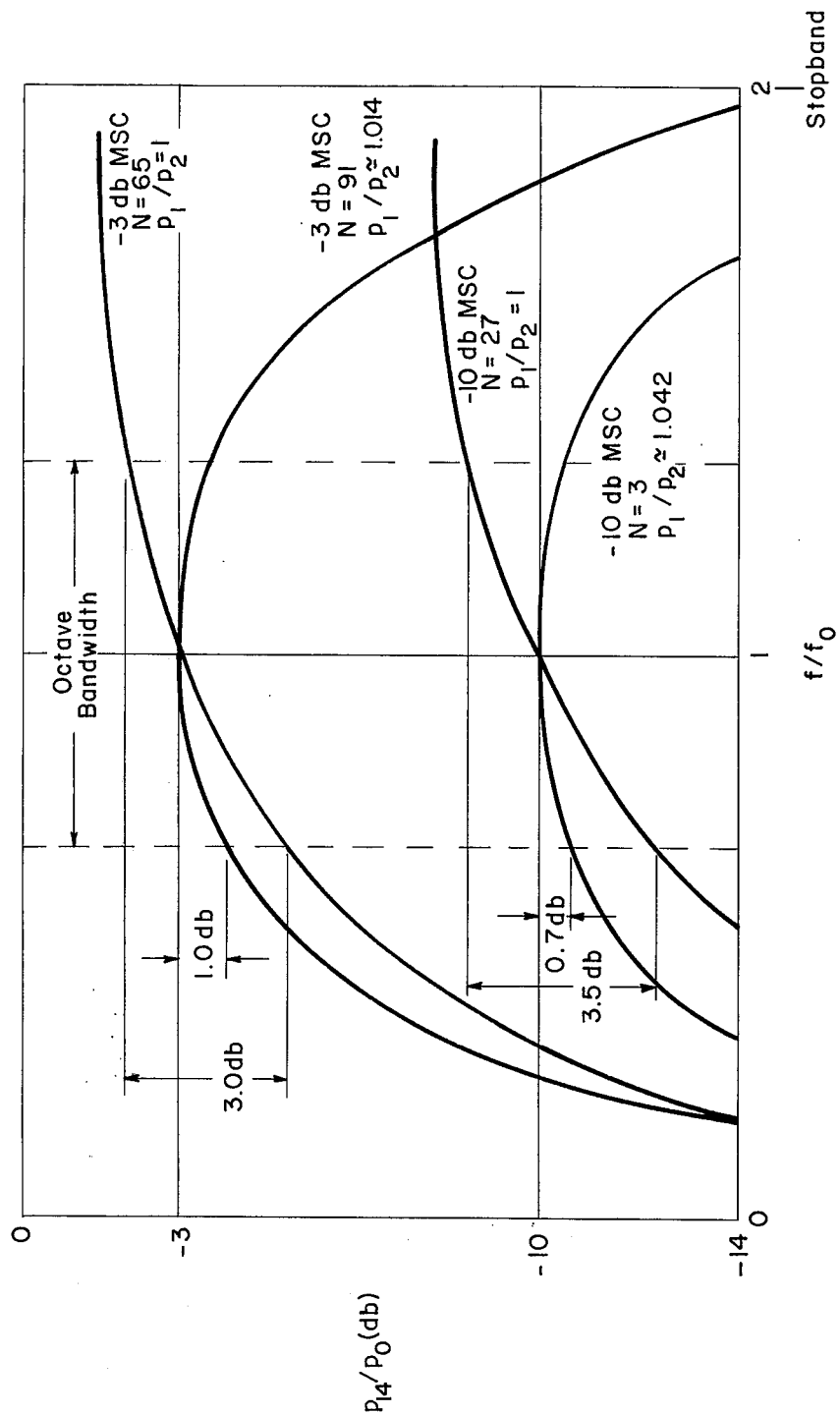
FIG. 3 is a graphical presentation comparing the frequency response characteristics of the broadband invention and conventional multistrip couplers.

Referring now to FIG. 2, there is shown a broadband surface acoustic wave fractional efficiency coupler having single input and single output transducers. A conventional interdigital transducer 21 is disposed on a piezoelectric substrate surface 23 and includes input terminals 25 and 27 coupled to a conventional source 29 of input electrical signals whereby associated surface acoustic wave energy $P_o$ is launched in Track 1 as indicated by arrow 31. This energy is intercepted by a tapping portion 33 of a special multistrip coupler array 35 also disposed on the substrate surface 23 and which includes a launching portion 37 whereby energy $P_{14}$, a predetermined fraction of the intercepted energy in Track 1, is launched in Track 2, as indicated by an arrow 39, twoard a conventional interdigital output transducer 41. Such energy incident on the output transducer 41 is converted into an associated electrical output signal at terminals 43 and 45 and is seen across a conventional load as indicated by a load 47 coupled to these terminals.

Where the device was designed for operation on LiNiO$_3$ as a $-3$ dB coupler having a 30 MHz center frequency, which was one-half the stopband frequency, $N = 91$, and $p_1/p_2 \simeq 1.014$. For a $-10$ dB coupler, the values were found to be $N = 37$, and $p_1/p_2 \simeq 1.042$. A graphical presentation of a comparison of frequency response characteristics of broadband fractional efficiency couplers constructed in accordance with the present invention and conventional multistrip couplers is shown in FIG. 3. The data used to plot these graphs was obtained by the aforementioned iterative computer search process where the appropriate values were determined for $-3$ dB and $-10$ dB couplers designed for operation at a normalized frequency $\gamma = 0.25$. FIG. 3 makes the improved bandpass characteristics of the invention, referenced to a one octave bandwidth, very apparent.

Figure 4:
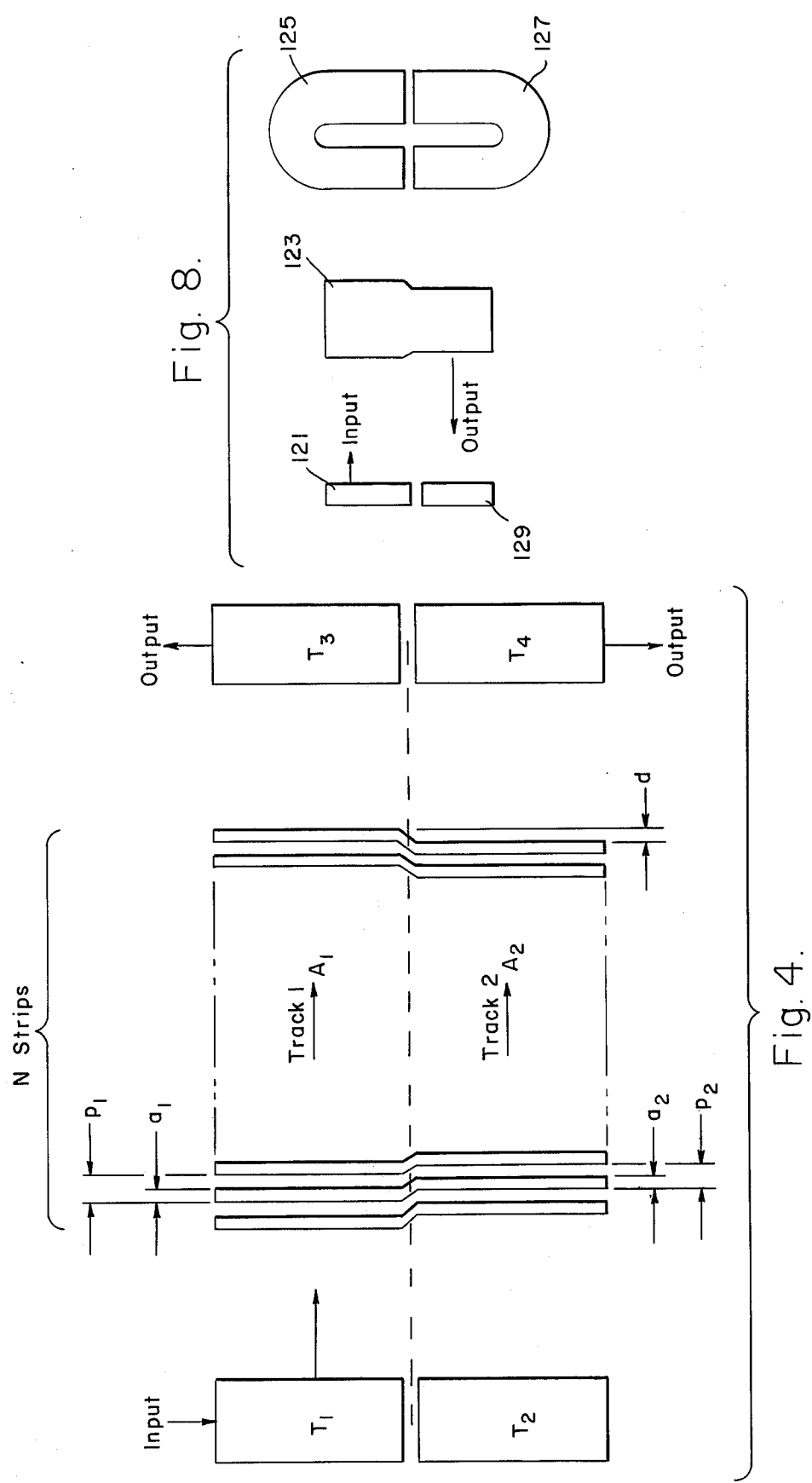
FIG. 4 illustrates schematically a broadband 90° hybrid junction having a multistrip array with a variation in strip spacings $p_1$ and $p_2$ in the two tracks, and a phase compensating offset $d$ in accordance with another embodiment of the present invention.

The present invention is advantageously applicable to a family of multiple devices. For example, FIG. 4 illustrates the basic geometrical characteristics of a broadband, 90° hybrid junction wherein there is a predetermined variation of the strip spacings $p_1$ and $p_2$ in the two tracks, and the inclusion of a phase compensating offset $d$ to maintain a 90° phase shift between the coupled outputs at transducers T$_3$ and T$_4$.

A 90° hybrid junction is a four port device which has the property that a signal input in one port, at T$_1$ for example, is coupled equally into two (T$_3$ and T$_4$) of the remaining three ports, but not into the fourth, T$_2$, and the output signals are 90° out of phase. Because of the required phase relationship of this type of operation, in addition to the variation between $p_1$ and $p_2$, which alone would lead to a linear phase variation with frequency between the two outputs, the device incorporates an appropriate offset distance $d$, as previously described, in order to compensate for the linear phase shift. It will be noted that the configuration is essentially identical to that previously described in detail with reference to the device shown in FIG. 1.

Figure 5:
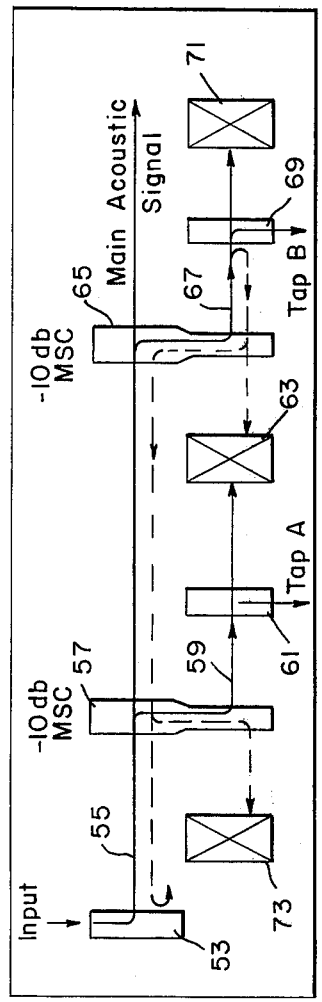
FIG. 5 shows a nonreflecting tapped delay line using the fractional transfer efficiency multistrip coupling array in accordance with still another embodiment of the invention.

Additionally, the invention may be utilized in a tapped delay line configuration to extract a fraction of the surface acoustic wave signal in the main delay line path (Track 1) into a selected tap transducer, as illustrated in FIG. 5. The tapped delay line 51 includes an input transducer 53 which, in response to an electrical input signal, launches surface acoustic wave energy along a main path 55. This energy is intercepted by a first broadband multistrip coupler array 57, as previously described, which diverts a portion of the energy to a second path 59 and toward a first tapping output transducer 61. Any energy that is not converted into electrical output energy and passes by the transducer 61 is absorbed by a conventional surface acoustic wave energy absorber 63.

Energy not diverted by the first tapping broadband multistrip coupler array 57 is then intercepted by a second tapping broadband and multistrip coupler array 65. This also being a fractional efficiency device, it diverts only a portion of the energy incident thereon and directs it along a path 67 toward a second tapping output transducer 69. Again, some energy not converted to an electrical output signal by the transducer 69 will pass on to a second absorber 71, while a small fraction of the energy incident on the transducer will be reflected either back along main path 55 by the coupler 65 or through the array 65 to the first absorber 63 where it is dissipated. The reflected energy in the main path 55 will then either be diverted to the first coupler array 52 to a third absorber 73 or proceed toward and be reflected by the input transducer 53. Because of the directionality of the broadband multistrip coupler arrays and the placement of the absorbers, there are essentially no tap reflections having magnitudes that could cause deleterious effects. Although only two taps are shown in this embodiment, it should be understood that the invention may be practiced with any number of taps.

Figure 6:
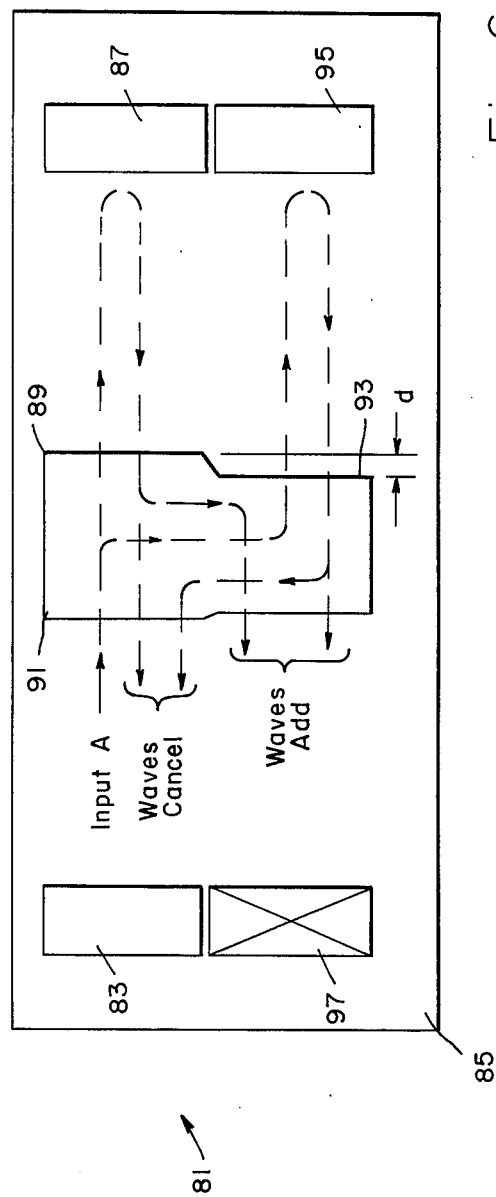
FIG. 6 illustrates yet another embodiment of the present invention utilizing a broadband $-3$ dB multistrip coupler array and an echo trap.

A multistrip coupler echo trap is a device which suppresses spurious output signals which are due to reflections in the delay line path. Such a device incorporating the broadband fractional efficiency coupler is illustrated in FIG. 6. This embodiment of the invention includes a substrate of piezoelectric material 81, and an input transducer 83 disposed on a surface 85 capable of supporting propagating surface acoustic wave energy, the input transducer being adapted to launch such propagating energy along a first path or track in the direction of a conventional dummy transducer 87 having a matched load. Also disposed on the surface 85 is a $-3$ dB broadband multistrip coupler array 89 having different strip periods, as previously described in detail, a tapping portion 91 of which is disposed in the first track and a launching portion 93 of which is adapted to launch one-half the energy intercepted by the tapping portion along a second path toward an output transducer 95.

Since the dummy transducer 87 is electrically matched to the output transducer 95, and both receive equal amounts of energy, any reflected energy will also be equal in amount. As can be seen in FIG. 6 by the dashed path lines, these reflected signals travel in the $-3$ dB coupler array 89 in opposite directions to set up an interference whereby the reflected signals cancel in the first track and add in the second track. Negligible signal is thus reflected into the input transducer (where it could again be reflected into the output transducer).

The signal reflected into the second track is absorbed by a conventional acoustic absorber 97 such as a suitable surface acoustic wave absorbing coating. In this embodiment, an appropriate offset $d$ is provided to compensate for phase variations, as previously discussed.

Figure 7:
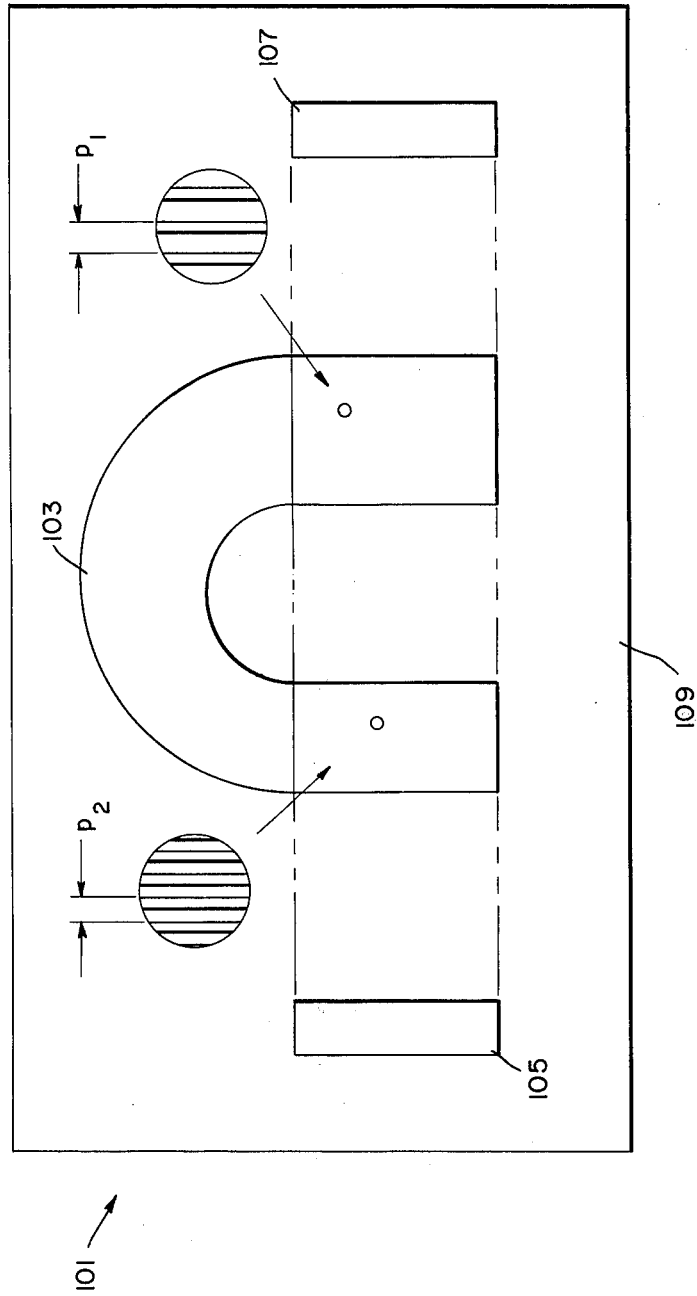
FIG. 7 is a schematic representation of a broadband surface acoustic wave reflector constructed in accordance with still a further embodiment of the invention.

Referring now to a broadband surface acoustic wave reflector 101 shown in FIG. 7, it can be seen that a U-shaped broadband multistrip coupler array 103 is utilized. This embodiment also includes a first input transducer 105 and a second input transducer 107, which along with the array 103 are disposed on a piezoelectric substrate surface 109. The configuration of the coupler array 103 is such that all incident surface wave energy propagating along the tracks between the transducers and the coupler array are reflected. As shown in the enlarged portions of the two portions of the coupling array, the ratio of $p_1/p_2$ is chosen for broadband operation in accordance with the invention as previously described.

Yet a further embodiment of the invention is shown in FIG. 8. Here there is illustrated a geometrical configuration of a broadband reflecting track changer incorporating an input transducer 121, a −3 dB hybrid 123 and broadband reflectors 125 and 127, all of which components have heretofore been described with respect to other embodiments of the invention. This configuration is similar to the above-described echo trap except that the output and dummy transducers are replaced by the surface acoustic wave reflectors. As in the echo trap, all reflected signals are directed into the second track. Again, the phase offset $d$ of the broadband multistrip coupler array 123 is properly selected to compensate for phase variations.

It should be understood that a position offset $d$ results in a change in an insertion phase characteristic such that if the acoustic path length is increased by an amount $d$, the insertion phase is increased by an amount $2\pi fd/v$, where $f$ is the frequency and $v$ is the velocity of the propagating surface acoustic wave energy.

From the foregoing, it should be understood that there has hereinabove been described a new and improved surface acoustic wave frictional efficiency coupler having a broad, symmetrical passband that has many applications including but not limited to 90° hybrid junctions, nonreflecting tapped delay lines, echo trap, surface acoustic wave reflector, and the like.

Although certain materials and processes have been specified herein, it should be understood that the materials and processes used in describing the various embodiments of the invention are not critical, and any material and process providing the same or similar characteristic or component may be utilized. It should also be understood that although the present invention has been shown and described with reference to particular embodiments, nevertheless changes and modifications which are obvious to persons skilled in the art to which the invention pertains are deemed to lie within the spirit, scope and contemplation of the invention.

What is claimed is:

1. A Fractional efficiency surface acoustic wave coupling device, comprising:
   a substrate of piezoelectric material having a surface capable of supporting propagating surface acoustic wave energy;
   input means including an input transducer disposed on said surface for launching surface acoustic wave energy along a first track on said surface in response to an electrical input signal;
   output means including an output transducer disposed on said surface for detecting surface acoustic wave energy propagating along a second track on said surface and producing a corresponding electrical output signal; and
   coupler means including a multistrip coupling array of a predetermined number N of conductive strips disposed on said surface, said coupling array having a tapping portion in said first track and an approximately equal length launching portion in said second track for launching along said second track only a portion of said surface acoustic wave energy incident on said tapping portion, the strip period $p_1$ of said strips in said tapping portion being different than the strip period $p_2$ of said strips in said launching portion, the strip period difference being defined by a predetermined strip period ratio $p_1/p_2$ which in conjunction with said predetermined strip number N provides a broadband device having a desired transfer efficiency less than unity at a desired center frequency, the downstream end of said launching portion of said multistrip coupling array being offset by a distance $d$ in an upstream direction relative to the downstream end of said tapping portion to provide a desired phase shift characteristic.

2. The fractional efficiency coupling device according to claim 1, wherein said input transducer is a first port and said output transducer is a fourth port, and also comprising a second port in the form of a third transducer disposed on said surface in alignment with said second track on the same side of said multistrip coupling array as said first port, and further comprising a third port in the form of a fourth transducer disposed on said surface in alignment with said first track on the side of said multistrip coupling array opposite that of said first port, said distance $d$ being selected to provide a 90° phase shift between output signals provided at said third and fourth ports.

3. The fractional efficiency coupling device according to claim 1, also comprising a selected additional number of said multistrip coupling arrays disposed downstream of said first mentioned multistrip coupling array and each having their tapping portions disposed in said first track and having their launching portions in separate additional tracks essentially parallel to said second track, a separate output transducer being disposed on said surface and associated with each of said additional multistrip coupling arrays downstream of their respective launching portions, and a separate surface acoustic wave absorber being disposed on said surface and associated with a different one of said launching portions and on the side thereof opposite an associated one of said output transducers, to provide a nonreflecting tapped delay line.

4. The fractional efficiency coupling device according to claim 1, wherein said multistrip coupling array provides −3 dB coupling between said tapping and launching portions, and also comprising a second output transducer and associated load matching the characteristics of said first mentioned output transducer, said second output transducer being disposed on said surface in said first track directly opposite said first output transducer, and further comprising a surface acoustic wave absorber disposed in axial alignment with said second track on the side of said launching portion opposite that of said first output transducer, said distance $d$ being selected to provide a 90° phase shift between surface acoustic wave energy incident on said first and second output transducers, to provide an echo trap.

5. A fractional efficiency surface acoustic wave reflecting track changer, comprising:
- a substrate of piezoelectric material having a surface capable of supporting propagating surface acoustic wave energy;
- input means including an input transducer disposed on said surface for launching surface acoustic wave energy along a first track on said surface in response to an electrical input signal;
- output means including an output transducer disposed on said surface for detecting surface acoustic wave energy propagating along a second track on said surface and producing a corresponding electrical output signal;
- coupler means including a first, second, and third multistrip coupling array, each of a predetermined number N of conductive strips disposed on said surface, said coupling arrays each having a tapping portion in an associated input track and an approximately equal length launching portion for launching along an associated track only a portion of said surface acoustic wave energy incident on said tapping portion, the strip period $p_1$ of said strips in said tapping portion being different than the strip period $p_2$ of said strips in said launching portion, the strip period difference being defined by a predetermined strip period ratio $p_1/p_2$ which in conjunction with said predetermined strip number N provides a broadband multistrip coupling array having a desired transfer efficiency less than unity at a desired center frequency, said tapping portions of said first and second arrays being disposed in said first track, the latter being downstream of the former, said launching portion of said first array and said tapping portion of said third array being disposed in said second track, the latter being on the same side of the former as said second array and on the side of said former opposite said output transducer, said second and third arrays being U-shaped whereby said launching portion of said second array is in said first track and said launching portion of said third array is in said second track, the downstream end of said launching portion of said multistrip coupling array being offset by a distance i d in an upstream direction relative to the downstream end of said tapping portion to provide a desired phase shift to compensate for the phase shift caused by said predetermined strip period ratio $p_1/p_2$.

* * * * *